United States Patent
Fischer et al.

(10) Patent No.: US 6,744,212 B2
(45) Date of Patent: Jun. 1, 2004

(54) PLASMA PROCESSING APPARATUS AND METHOD FOR CONFINING AN RF PLASMA UNDER VERY HIGH GAS FLOW AND RF POWER DENSITY CONDITIONS

(75) Inventors: Andreas Fischer, Castro Valley, CA (US); Dave Trussell, Fremont, CA (US); Bill Kennedy, Fremont, CA (US); Peter Loewenhardt, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/077,072

(22) Filed: Feb. 14, 2002

(65) Prior Publication Data

US 2003/0151371 A1 Aug. 14, 2003

(51) Int. Cl.[7] .............................................. C23C 16/00
(52) U.S. Cl. ............................ 315/111.21; 118/723 E; 118/723 I; 156/345.18; 315/111.91
(58) Field of Search ...................... 315/111.21, 111.71, 315/111.11, 111.91, 111.81; 219/121.43, 121.4, 695, 745, 746; 156/345.18, 345.21, 345; 118/723 E, 723 I; 438/710–715

(56) References Cited

U.S. PATENT DOCUMENTS

| | | | | | |
|---|---|---|---|---|---|
| 6,091,045 | A | * | 7/2000 | Mabuchi et al. | 219/121.43 |
| 6,178,919 | B1 | * | 1/2001 | Li et al. | 118/723 E |
| 6,403,491 | B1 | * | 6/2002 | Liu et al. | 438/710 |

* cited by examiner

Primary Examiner—Wilson Lee
(74) Attorney, Agent, or Firm—Lam Research Corporation

(57) ABSTRACT

The present invention includes a system and method for confining plasma within a plasma processing chamber. The plasma processing apparatus comprises a first electrode, a power generator, a second electrode, at least one confinement ring, and a ground extension surrounding the first electrode. The first electrode is configured to receive a workpiece and has an associated first electrode area. The power generator is operatively coupled to the first electrode, and the power generator is configured to generate RF power that is communicated to the first electrode. The second electrode is disposed at a distance from the first electrode. The second electrode is configured to provide a complete electrical circuit for RF power communicated from the first electrode. Additionally, the second electrode has a second electrode area that is greater than the first electrode area. At least one confinement ring is configured to assist confine the plasma. The plasma is generated with the RF power being communicated between the first electrode and the gas residing inside the confinement rings. The ground extension drains charge from the plasma boundaries with a grounded conductive surface.

15 Claims, 3 Drawing Sheets

PLASMA PROCESSING APPARATUS AND METHOD FOR CONFINING AN RF PLASMA UNDER VERY HIGH GAS FLOW AND RF POWER DENSITY CONDITIONS

BACKGROUND OF THE INVENTION

1. Field of Invention

The present invention is related to semiconductor fabrication. More particularly, the invention is related to plasma processing during semiconductor fabrication.

2. Description of Related Art

In the fabrication of semiconductor based devices (e.g. integrated circuits or flat panel displays) layers of material may alternately be deposited onto and etched from a workpiece surface (e.g., the semiconductor wafer or the glass panel). As is well known in the art, the etching of the deposited layer(s) may be accomplished by a variety of techniques, including plasma-enhanced etching. In plasma-enhanced etching, the actual etching of the workpiece takes place inside a plasma processing chamber. During the etching process, a plasma is formed from a suitable etchant source gas to etch areas of the workpiece that are unprotected by the mask, leaving behind the desired pattern.

There are two types of plasmas that are employed in plasma-enhanced etching, namely, confined plasmas and unconfined plasmas. Unconfined plasmas touch the plasma processing chamber walls and may contaminate the workpiece by re-depositing atoms from the chamber walls on to the workpiece. Typically, the plasma processing chamber walls are made of materials that are incompatible to the workpiece. With confined plasma, there is little or no contamination since the plasma is stopped by some means from reaching the chamber walls. Thus, confined plasmas provide a level of cleanliness that is not provided by well-known unconfined plasmas.

Generating confined plasma may prove, however, difficult since it has a high electric potential with respect to the chamber walls. This high potential in connection with a given geometry of the reactor and gas pressure outside the confinement means can lead to electric breakdown of the gas and the ignition of plasma outside the confined region. Furthermore, large RF return currents on the inner surface of the chamber walls may inductively couple RF energy into the gas outside the confinement means. This may also lead to electric breakdown of the gas and, therefore, will enable the plasma to spread to the chamber walls. This undesirable state will be referred to as unconfinement.

Typically, plasma can be prevented from reaching the chamber walls by establishing a variety of repulsive fields, either electric or magnetic in nature. By way of example, the plasma is confined by a plurality of confinement rings resident within the chamber walls and by means of draining charge out of the plasma just before it can reach the inner limits of the confinement rings. Since the confinement rings are made from an insulating material they will charge to a potential comparable to that of the plasma. Consequently, a repulsive electric field will emanate from the leading edge of each confinement ring that will keep plasma from protruding any further out toward the chamber walls.

Among the different types of plasma etching systems, those utilizing confinement rings have proven to be highly suitable and effective for the production of semiconductors. An example of such a system may be found in commonly assigned U.S. Pat. No. 5,534,751 and U.S. Pat. No. 6,019,060 which are hereby incorporated by reference.

The Lenz et al. U.S. Pat. No. 5,534,751 disclosure describes a plasma etching apparatus utilizing plasma confinement. The plasma etching apparatus includes confinement rings that comprise quartz rings that are positioned to surround an interaction space between two electrodes of the apparatus where a plasma is formed during operation of the apparatus. The dimensions of the slots are chosen to insure that charged particles of spent gases in the plasma exiting the interaction space are neutralized by wall collisions as they exit the slots. Two voltage sources of different frequencies are used to apply voltages to the electrodes in a fashion that isolates each source from the other. The other Lenz U.S. Pat. No. 6,019,060 disclosure describes the use of confinement rings in which the confinement rings are raised and lowered to facilitate workpiece transport.

An illustrative example of a plasma processing chamber having confinement rings is shown in FIG. 1. The Figure shows a cross-sectional view of the plasma processing chamber 100 having confinement rings 102a and 102b. Although only two confinement rings are shown, it should be understood that any number of confinement rings may be provided. Within plasma processing chamber 100, there is shown a first electrode 104, representing the workpiece holder on which a workpiece 106 is positioned during etching. The first electrode 104 may be implemented by any suitable chucking system, e.g. electrostatic, mechanical, clamping, vacuum, or the like, and is surrounded by an insulator 108. During etching, RF power supply 110 may generate RF power having a frequency of about 2 MHz to about 27 MHz to first electrode 104.

Above workpiece 106, there is disposed a second upper electrode 112, which is coupled to a reactor top formed of a conductive material such as aluminum. The reactor top is coupled to confinement rings 102. Second upper electrode 112 is electrically insulated from grounded chamber wall 116 by insulator 118 and is powered by an RF power supply 120 to facilitate the formation of a plasma out of etchant source gases supplied via a gas line (not shown). RF power supply 120 may have any suitable frequency, such as 2 MHz to 27 MHz. It shall be appreciated by those skilled in the art that the plasma processing chamber of FIG. 1 represents a capacitively coupled plasma processing chamber although the confinement rings also operate well with other types of processing chambers such as inductively coupled plasma processing chambers.

Other approaches for confining plasma include magnetic confinement. The U.S. Pat. No. 5,767,628 and U.S. Pat. No. 5,936,352 both use magnetic confinement to generate a partially confined plasma and are hereby incorporated by reference.

Keller et al. in U.S. Pat. No. 5,767,628 discloses a processing apparatus including a chamber, an induction coil for providing a RF induced electromagnetic field to generate a plasma, and a plurality of magnetic dipoles that produce a confined plasma within the processing chamber.

Samukawa et al. in U.S. Pat. No. 5,936,352 discloses a processing apparatus that includes a plasma chamber having a first set and a second set of parallel electromagnetic elements. An oscillating energy having a first phase is applied to the first set of parallel electromagnetic elements. Another oscillating energy having an opposite phase is applied to the second set of parallel electromagnetic elements to produce oppositely moving energy fields in the processing chamber such that electrons are confined in a plasma produced in the chamber.

In spite of the well-known method for confining plasma either partially or fully, a novel system and method for generating confined plasma is needed. This need is caused by the semiconductor industry shifting from 200 mm wafers to 300 mm wafers. The 300 mm wafer occupies more than twice the area of the 200 mm wafer. As a result of the 300 mm wafer being larger, the operating conditions for semiconductor fabrication change substantially. Prior art methods for generating a confined plasma that worked for 200 mm wafer do not work on 300 mm wafers due to the higher gas flows and higher radio frequency (RF) power levels.

Therefore it would be beneficial to provide an apparatus that generates a confined plasma that occupies a substantially larger volume.

Additionally, it would be beneficial to provide an apparatus that confines plasma in processing chamber that operates using high gas flows.

It would also be beneficial to provide an apparatus that confines plasma in a processing chamber that operates with high RF power levels.

Furthermore, it would be beneficial to provide a method for generating a confined plasma in a processing chamber that operates using high gas flows.

Further still, it would be beneficial to provide a method for generating a confined plasma in a processing chamber that operates using high RF power levels.

SUMMARY OF INVENTION

The present invention includes a system and method for confining plasma using a plasma processing apparatus. The plasma processing apparatus comprises a first electrode, at least one power generator, a second electrode, at least one confinement ring, and a ground extension for draining charge from the plasma boundaries. The first electrode is configured to receive a workpiece and has an associated first electrode area. The power generator is operatively coupled to the first electrode, and the power generator is configured to generate an RF power that is communicated to the first electrode. The second electrode is disposed at a distance from the first electrode. The second electrode is configured to provide a complete electrical circuit for RF power communicated from the first electrode. Additionally, the second electrode has a second electrode area that may vary in size from that of the first electrode area. At least one confinement ring is configured to assist in confining the plasma. The plasma is generated with the RF power being communicated between the first electrode and the second electrode. The ground extension drains charge from the plasma boundaries with a grounded conductive surface.

Additionally, the invention includes a method for generating a confined plasma in a plasma processing apparatus. The method includes providing a first electrode configured to receive a workpiece in which the first electrode has a first electrode area. Additionally, the method includes providing a second electrode disposed at a distance from the first electrode. The second electrode is configured to provide a complete electrical circuit for RF power communicated from the first electrode. Further still, the second electrode has a second electrode area that may vary in size from that of the first electrode area. The method then provides for the engaging of a power supply to communicate a plurality of electrical charge from the first electrode and the second electrode. The method also provides for the draining of the plurality of charge at a plasma boundary. The plasma boundary provides a perimeter for the confined plasma.

BRIEF DESCRIPTION OF THE DRAWINGS

Preferred embodiments of the present invention are shown in the accompanying drawings wherein.

DETAILED DESCRIPTION

Figure 1:
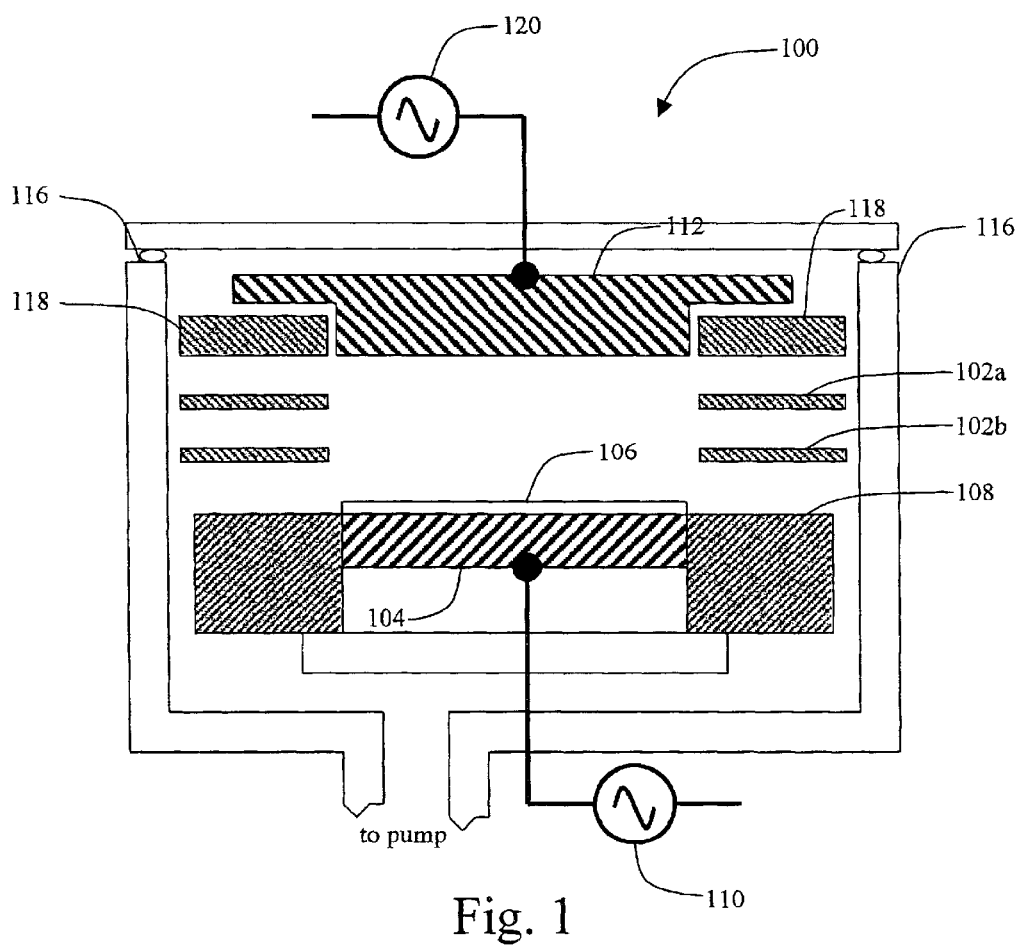
FIG. 1 is a cross-sectional view of a prior art plasma processing chamber.

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

Typically, the plasma processing chamber walls are made of materials that are incompatible to the workpiece. With confined plasma, there is little or no contamination caused by the chamber walls. Thus, confined plasmas provide a level of cleanliness that is not provided by well-known unconfined plasmas.

Generating confined plasma for 300 mm applications is difficult because of the higher RF power and higher gas flow rates that are applied during the etching process. A plurality of embodiments are described below that are applicable to the 300 mm applications. Additionally, it shall be appreciated by those skilled in the art having the benefit of this disclosure that the apparatuses and methods described here are not limited to 300 mm applications. The apparatuses and methods may be adapted to be used for applications requiring the confinement of plasma in a high gas flow environment that employ high RF power levels. In this invention high gas flow rates refer to flow rates of approximately 1500 sccm, and high RF power levels refer to power levels of approximately 2 W per $cm^3$ of plasma volume.

In general, the present invention includes an apparatus and method for confining plasma within a plasma processing apparatus. The plasma processing apparatus comprises a first electrode operatively coupled to a power generator, a second electrode, at least one confinement ring, and a ground extension for draining charge from the plasma boundaries.

The plasma processing apparatus is configured to receive a gas that is converted into a plasma by the plasma processing apparatus. By way of example and not of limitation, the relatively high gas flow rate that is pumped into the plasma processing chamber is 1500 sccm. Gas flow rates less than 1500 sccm may also be applied.

The first electrode is configured to receive a workpiece and has an associated first electrode area that is adapted to receive the workpiece. The first electrode is operatively coupled to at least one power supply. The power supply is configured to generate a RF power that is communicated to the first electrode.

The second electrode is disposed at a distance from the first electrode. The second electrode is configured to provide a complete electrical circuit for RF power communicated from the first electrode. Additionally, the second electrode has a second electrode area that may vary in size from that of the first electrode area. In one embodiment, the second electrode area is greater than the first electrode area.

To generate the plasma within the plasma processing apparatus, the power supply is engaged and RF power is communicated between the first electrode and the second electrode. The gas is then converted to a plasma that is used for processing the semiconductor or glass substrate. By way of example and not of limitation, RF power levels of 2 W per $cm^3$ of plasma volume are applied. RF power levels of less than 2 W per $cm^3$ of plasma volume may also be applied.

At least one confinement ring is disposed near the first electrode area and the second electrode area, the at least one confinement ring is configured to help confine the plasma substantially within the volume defined by the confinement rings. The plasma is generated with the RF power being communicated between the first electrode and the second electrode.

The ground extension is adjacent the first electrode and is separated from the first electrode by a dielectric. The ground extension drains RF current from the plasma boundaries and includes a RF grounded surface.

The present invention describes four alternative embodiments for generating a confined plasma. The four alternative embodiments share certain common characteristics, namely, they use two electrodes and a ground extension plus at least one confinement ring. The first electrode and second electrode may vary in the size of their surface areas. In one embodiment, the first electrode has a smaller area than the second electrode. The first electrode is configured to receive a workpiece, and the first electrode is operatively coupled to the RF power supply. Additionally, each of the embodiments provides a ground extension that drains electric charge from the fringes of the confined plasma.

For purposes of this patent application, the term "confinement window" refers to the process parameter space within which confined plasma can be maintained. In particular, it refers to the RF power and gas flow ranges for which a confined operation of the plasma is possible. Thus, the present invention provides an apparatus and method for increasing the confinement window of a plasma system for the processing of a workpiece such as a semiconductor or glass dielectric.

The four embodiments described below include a ground extension with protrusion embodiment, a level ground extension embodiment, an enhanced area electrode embodiment, and a notched electrode embodiment and are described in FIG. 2, FIG. 3, FIG. 4 and FIG. 5, respectively. As described above all four embodiments include a ground extension near the first electrode that is configured to drain charge from the edges of the confined plasma. Additionally, all four embodiments include the first electrode that is configured to receive the workpiece and may have a first electrode surface area that is greater than the second electrode area.

For illustrative purposes, the present invention employs capacitive coupling to generate the plasma in the processing chamber. It shall be appreciated by those skilled in the art, that the present apparatus and methods may be adapted to be used with inductively coupled plasma.

Additionally, and for illustrative purposes only, a dual frequency power supply is used to generate the high electric potential that is applied to a gas to produce the plasma. More particularly, the illustrative power supply is a dual power frequency power supply operating at 2 MHz and 27 MHz that is included in etching systems manufactured by Lam Research. It shall be appreciated by those skilled in the art that other power supplies capable of generating plasma in the processing chamber may also be employed. It shall be appreciated by those skilled in the art that the invention is not limited to RF frequencies of 2 MHz and 27 MHz but may be applicable to a wide range of frequencies.

It shall be appreciated by those skilled in the art that an additional alternative embodiment exists for each of the embodiments described below. In the additional alternative embodiment, the second "grounded" electrode is configured to communicate RF power to generate a plasma in the processing chamber. However, in order to achieve the desired effect of a decrease in bias voltage at the second electrode and increase in bias voltage at the first "powered" electrode, the second electrode is configured to communicate less RF power than the first powered electrode that is adapted to receive the workpiece. It shall be appreciated by those skilled in the art having the benefit of this disclosure, that the goal of achieving plasma confinement by decreasing the bias voltage on the confinement rings and increasing the bias voltage on the first "powered" electrode is achieved with this additional alternative embodiment. Furthermore, it shall be appreciated by those skilled in the art having the benefit of this disclosure that this additional alternative embodiment may be applied to each of the embodiments disclosed hereinafter.

Ground Extension With Protrusion Embodiment

Figure 2:
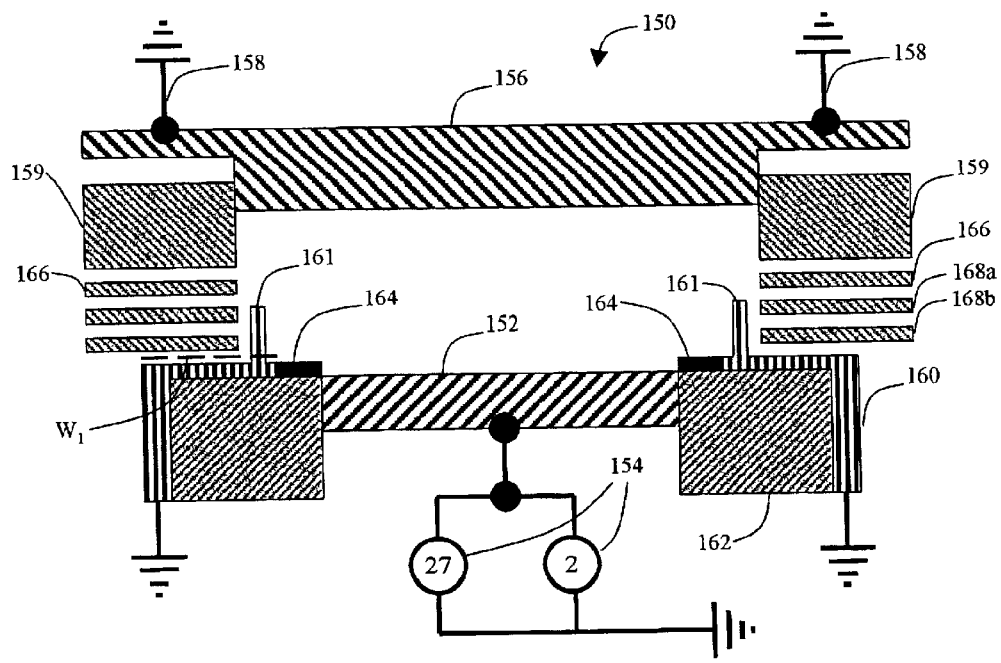
FIG. 2 is a cross-sectional view of a plasma processing apparatus having a protrusion at the ground extension.

Referring to FIG. 2, there is shown a cross-sectional view of a plasma processing apparatus 150 having a ground extension with a protrusion. This embodiment includes a first electrode 152 that is composed of a conductive material which is operatively coupled to an RF power supply 154. As described above, the RF power supply 154 is a dual frequency power supply. By way of example and not of limitation, the first electrode has an area that is adapted to receive a 300 mm workpiece.

In operation, the powered first electrode 152 is configured to receive a workpiece (not shown) and is configured to clamp the workpiece to the first electrode 152. The workpiece is electrostatically clamped or "chucked" to the first electrode using well-known systems and methods. These well-known systems and methods include coating the first electrode 152 with a dielectric material that incorporates high-voltage electrodes (not shown) for chucking and dechucking purposes.

The second electrode 156 is disposed above the first electrode 152. Generally, the second electrode is made from a material that is compatible with the workpiece to avoid contamination. The second electrode 156 is connected to a ground 158 and provides a complete electrical circuit for the RF power. Additionally, the second electrode 156 has a surface area that may vary from that of the first electrode 152. In one embodiment, the second electrode 156 has a greater surface area than the first electrode 152. In another embodiment, the second electrode 156 has the same surface area as the first electrode. By way of example and not of limitation, the second electrode is composed of a conductive material such as silicon or silicon carbide. Additionally, by way of example and not of limitation, the second electrode is located 25 mm from the first electrode.

The ground extension 160 is near the first electrode 152. The ground extension 160 has a protrusion 161 that projects from the plane of the ground extension 160. The protrusion is made from a conductor and makes electrical contact with the ground extension. The ground extension 160 is separated from the first electrode by a first dielectric ring 162. The first dielectric ring 162 is configured to receive the first electrode 152 and the ground extension 160. A second dielectric ring 164 separates the first electrode 152 from the ground extension 160. The second dielectric ring 164 sits in the same plane as the ground extension 160.

By way of example and not of limitation, the ground extension 160 is composed of a conductive material such as aluminum or silicon. Additionally, by way of example and not of limitation, the protrusion 161 that is approximately 5 mm above the plane of the ground extension 160. Furthermore, by way of example and not of limitation, the ground extension 160 is located 5 mm from the first electrode 152. Further still, by way of example and not of limitation, the first dielectric ring 162 and second dielectric ring 164 are both composed of quartz. Also, by way of example and not of limitation, the second dielectric ring 164 has a width of 5 mm which separates the first electrode 152 from the ground extension 160.

At least one confinement ring 166 is used to confine the plasma to the volume defined by the confinement rings. Additional confinement rings 168a and 168b are also shown. The confinement rings provide confinement to the plasma that is generated within the processing chamber. By way of example, the confinement rings 166, 168a and 168b are composed of quartz.

In operation, a gas is fed into the process chamber by a gas inlet (not shown). By way of example and not of limitation, the gas flow is up to 1500 sccm. Plasma is generated when RF power is communicated from the first electrode 152 to the gas inside the process chamber. The power supply communicates RF power levels of up to 2 W per $cm^3$ of plasma volume.

In addition to the confinement rings 166, 168a and 168b, the protrusion 161 from the ground extension 160 confines the plasma in the processing chamber. The protrusion 161 and the ground extension 160 confines the plasma by draining charge from the plasma without affecting the plasma charge density that is directly above the powered first electrode 152 that receives a workpiece. Thus, the protrusion 161 and the ground extension 160 helps contain the plasma.

In one embodiment in which the grounded second electrode 156 has a greater surface area than the powered first electrode 152, the plasma is also contained. It is hypothesized that the plasma is contained because the area ratio, i.e. ratio defined by dividing the second electrode area by the first electrode area, determines the bias voltage on the workpiece that is clamped to the powered RF electrode 152. The greater the area ratio between the grounded second electrode 156 and the powered first electrode 152, the greater the bias voltage at the powered first electrode 152. By the same token, the bias voltage on the grounded second electrode 156 and, especially, at the confinement rings 166, 168a and 168b is decreased if the before mentioned area ratio is increased. A reduced bias at the confinement rings will enable them to charge to the same electric potential as the plasma and, therefore, better repel the plasma away from the rings. Thus, the combination of the ground extension 160 disposed near the powered first electrode 152 and the increased surface area of the grounded second electrode with respect to the first electrode, increases the size of the confinement window for the plasma processing chamber.

Level Ground Extension Embodiment

Figure 3:
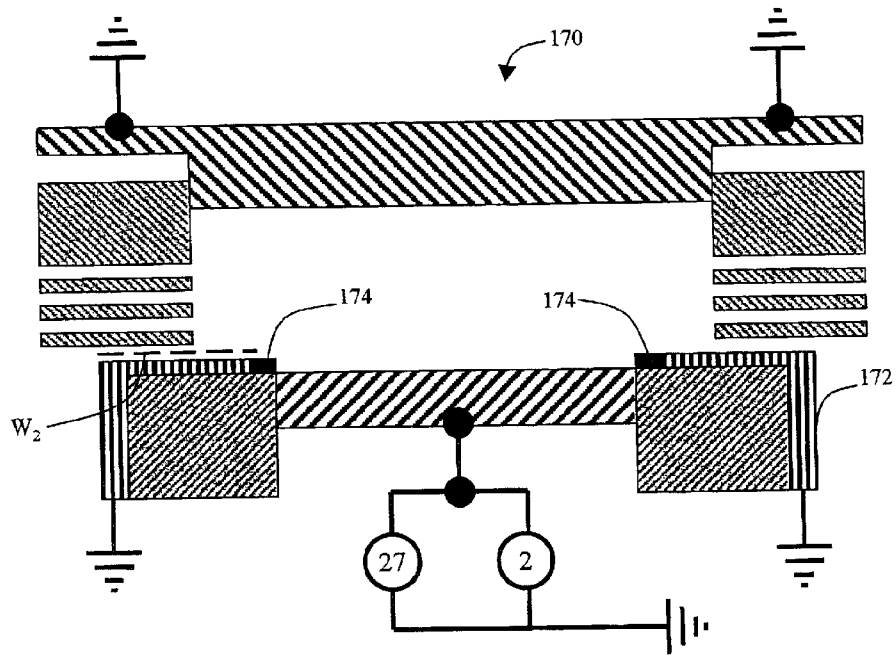
FIG. 3 is a cross-sectional view of a plasma processing apparatus having a large ground extension.

Referring to FIG. 3, there is shown a cross-sectional view of an alternative plasma processing apparatus having a level ground extension. The level ground extension embodiment 170 is similar to the ground extension with protrusion 150 embodiment described above. However, the level ground extension embodiment 170 comprises a level ground extension 172. The level ground extension 172 does not include a protrusion 161 extending from ground extension 160 as shown in FIG. 2. Additionally, the level ground extension 172 has a width, $W_2$, that is greater than the width, $W_1$, of the ground extension with protrusion 160.

In operation, the level ground extension 172 drains charge from the perimeter of the plasma. Thus, the level ground extension functions in a similar manner as the ground extension with protrusion 160.

Although the surface area for the level ground extension embodiment 170 is less than the surface area of the ground extension with protrusion embodiment 150, the level ground extension embodiment is easier to manufacture. Manufacturing of the level ground extension embodiment 170 is simplified because the protrusion 161 extending from the ground 160 does not have to be constructed, milled, assembled or fabricated.

Enhanced Area Embodiment

Figure 4:
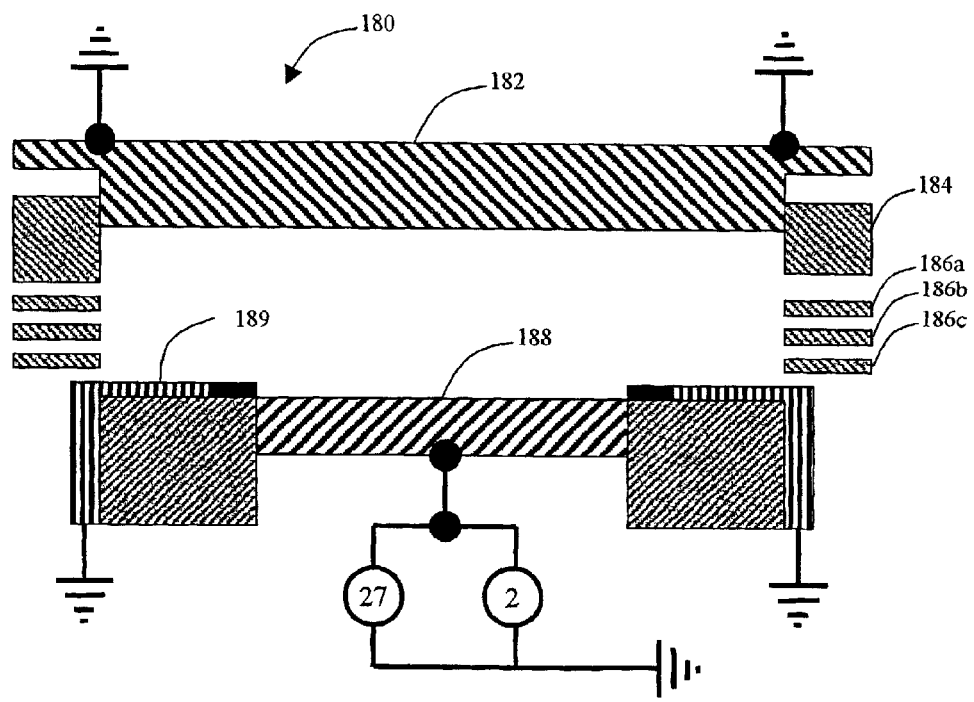
FIG. 4 is a cross-sectional view of a plasma processing apparatus having a second electrode with a substantially greater area than the workpiece electrode.

In FIG. 4 there is shown a cross-sectional view of an alternative plasma processing apparatus having a grounded electrode with an enhanced area. The enhanced area embodiment 180 of FIG. 4 is similar to the ground extension with protrusion embodiment 150 of FIG. 2 described above. However, the enhanced area embodiment 180 comprises a grounded second electrode 182 that has a larger surface area, i.e. "enhanced" area, compared to the surface area of grounded electrode 156 of FIG. 2. As a result of the larger surface area for the grounded second electrode 182, the inner diameter of the insulator 184 is greater than the inner diameter of insulator 159 for the ground extension with protrusion embodiment 150. Additionally, the inner diameter for confinement rings 186a, 186b, and 186c is greater than the inner diameter for confinement rings 166, 168a, and 168b. Another distinction is that the enhanced area embodiment 180 includes a level ground extension 189 similar to the level ground extension 172 described in FIG. 3. By way of example and not of limitation, the grounded second electrode 182 has an outer diameter which is 50 mm larger than that of the level ground extension embodiment.

In operation, the enhanced area embodiment 180 operates in a similar manner to the ground extension with protrusion embodiment 150 described above. However, the surface area for grounded electrode 182 is substantially greater than the surface for grounded electrode 156. As a result of the greater surface area for grounded electrode 182 in the enhanced area embodiment, the area ratio between the grounded electrode 182 and a powered electrode 188 is increased. This increased area ratio results in an increased bias voltage on the powered electrode 188 and a decreased bias voltage on the grounded electrode 182 and the confinement rings 186a, 186b and 186c. A decrease in bias voltage at the confinement rings 186a, 186b and 186c enhances the ability of the hardware to confine the plasma as described above and allows for a larger confinement window.

Notched Electrode Embodiment

Figure 5:
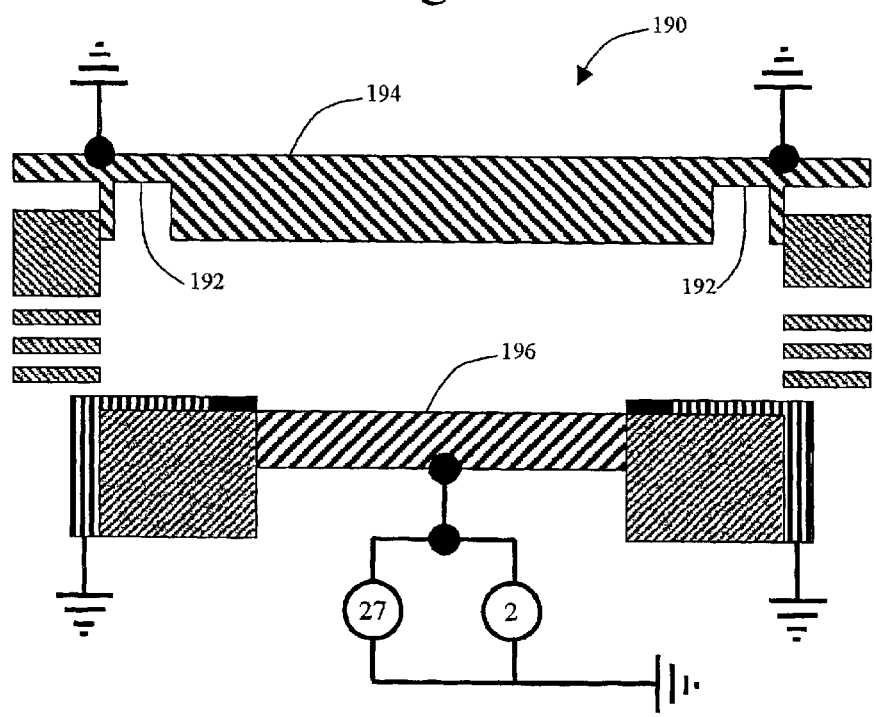
FIG. 5 is a cross-sectional view of a plasma processing apparatus having a notched second electrode.

Referring to FIG. 5 there is shown a cross-sectional view of the a plasma processing apparatus having a notched ground electrode. The notched electrode embodiment 190 is similar to the enhanced area embodiment 180 described in FIG. 4. However, the notched electrode embodiment includes a notch 192 within the grounded electrode 194. With the exception of the notch 192 in the grounded electrode 194, the grounded electrode is the same as the grounded electrode 182 of FIG. 4. The notch 192 increases the area ratio between the grounded electrode 194 and a powered electrode 196 further. As previously described, the increase in the area ratio results in an increased bias voltage on the powered electrode 196 and a decreased bias voltage on the grounded electrode 194 and the confinement rings. The notch 192 in the grounded electrode 194 will also dilute the plasma that moves in front of the confinement rings. Both, the further decreased bias voltage and plasma dilution in front of the confinement rings lead to further increase of the confinement window. By way of example and not of limitation, the notch 192 has a width of 10 mm, and a depth of 15 mm.

Although the description above contains many specifications, these should not be construed as limiting the scope of the invention but as merely providing illustrations of some of the presently preferred embodiments of this invention. Thus, the scope of the invention should be determined by the appended claims and their legal equivalents rather than by the illustrative examples given.

What is claimed is:

1. A plasma processing chamber configured to generate a confined plasma, comprising:
   a first powered electrode configured to receive a workpiece, said first powered electrode having a first electrode area;
   a power generator operatively coupled to said first powered electrode and configured to communicate power to said first powered electrode;
   a second electrode disposed at a distance from said first powered electrode, said first powered electrode and said second electrode configured to convert said gas to a plasma, said second electrode having a second electrode area;
   a plurality of confinement rings surrounding a volume within which said confined plasma is substantially disposed, the plurality of confinement rings being suspended parallel to and surrounding the first powered electrode and second electrode from within the plasma processing chamber, the plurality of confinement rings capable of being raised and lowered to extend into a region above and around the first powered electrode; and
   a ground extension adjacent said first powered electrode and surrounding said first powered electrode within the volume.

2. The plasma processing chamber of claim 1 wherein said ground extension further comprises a protrusion.

3. The plasma processing chamber of claim 1, wherein said ground extension is configured to drain charge from said plasma.

4. The plasma processing chamber of claim 1 further comprising an electrode area ratio of greater than 1.0, said area ratio defined by dividing said second electrode area by said first electrode area, such that said second electrode area is greater than said first electrode area.

5. The plasma processing chamber of claim 1 wherein said second electrode further comprises a notch, said notch configured to increase said second electrode area.

6. The plasma processing chamber of claim 5, further comprising an area ratio of greater than 1.0, said area ratio defined by dividing said second electrode surface area by said first electrode area, such that said second electrode surface area is greater than said first electrode area.

7. A plasma processing chamber configured to generate a confined plasma, comprising:
   a first powered electrode configured to receive a workpiece, said first powered electrode having a first electrode area;
   a power generator operatively coupled to said first powered electrode and configured to communicate power to said first powered electrode;
   a second electrode disposed at a distance from said first powered electrode, said first powered electrode and said second electrode configured to convert said gas to a plasma, said second electrode having a second electrode area;
   a plurality of confinement rings surrounding said first powered electrode, said second electrode and defining a volume within which the confined plasma is substantially disposed, the plurality of confinement rings being suspended parallel to and surrounding the first powered electrode and second electrode from within the plasma processing chamber, the plurality of confinement rings capable of being raised and lowered to extend into a region above and around the first lowered electrode; and
   a ground extension adjacent said first powered electrode, and surrounding said first powered electrode within the volume confined by the plurality of confinement rings.

8. The plasma processing chamber of claim 7, wherein said ground extension is configured to drain charge from said plasma.

9. The plasma processing chamber of claim 8, wherein said ground extension includes a protrusion.

10. The plasma processing chamber of claim 8 wherein said second electrode further comprises a notch, said notch configured to increase said second electrode area.

11. A method for generating a confined plasma in a plasma processing chamber including a plurality of confinement rings surrounding a volume within which said confined plasma is substantially disposed, said method comprising:
    receiving a gas in said plasma processing chamber;
    causing a first electrode to receive a workpiece, said first electrode operatively coupled to a power supply;
    causing a second electrode disposed at a distance from said first electrode to receive RF power from said first electrode, said second electrode having a second electrode area that is greater than said first electrode area;
    engaging a power supply to communicate RF power to said first electrode to generate a plasma; and
    positioning a ground extension adjacent said first electrode and within the volume defined by the plurality of confinement rings to drain a plurality of charge from said plasma, the plurality of confinement rings being positioned above and surrounding the first electrode, the second electrode and a portion of the ground extension.

12. The method of claim 11 further comprising generating said confined plasma due in part to said plurality of confinement rings and said ground extension.

13. The plasma processing chamber of claim 7, wherein said ground extension is separated from said first powered electrode by a dielectric.

14. The plasma processing chamber of claim 10 further comprising an area ratio of greater than 1.0, said area ratio defined by said second electrode surface area to said first electrode area, such that said second electrode surface area is greater than said first electrode area.

15. The plasma processing chamber of claim 1, wherein said ground extension is separated from said first powered electrode by a dielectric.

* * * * *